(12) United States Patent
Takizawa et al.

(10) Patent No.: US 11,892,464 B2
(45) Date of Patent: Feb. 6, 2024

(54) ELECTRONIC DEVICE, MANUFACTURING METHOD FOR ELECTRONIC DEVICE, ELECTRONIC APPARATUS, AND VEHICLE

(71) Applicant: Seiko Epson Corporation, Tokyo (JP)

(72) Inventors: Teruo Takizawa, Matsumoto (JP); Atsuki Naruse, Azumino (JP)

(73) Assignee: SEIKO EPSON CORPORATION

( * ) Notice: Subject to any disclaimer, the term of this patent is extended or adjusted under 35 U.S.C. 154(b) by 681 days.

(21) Appl. No.: 16/937,775

(22) Filed: Jul. 24, 2020

(65) Prior Publication Data
US 2021/0025915 A1    Jan. 28, 2021

(30) Foreign Application Priority Data

Jul. 25, 2019   (JP) ................. 2019-137146

(51) Int. Cl.
*G01P 1/02*    (2006.01)
*G01P 3/44*    (2006.01)
(Continued)

(52) U.S. Cl.
CPC .............. *G01P 1/026* (2013.01); *B60K 35/00* (2013.01); *G01C 19/5733* (2013.01);
(Continued)

(58) Field of Classification Search
CPC .. G01P 1/02; G01P 1/023; G01P 1/026; G01P 15/0802; G01C 19/5733; G01C 19/5769; G01C 19/5712; B81C 1/00325
See application file for complete search history.

(56) References Cited

U.S. PATENT DOCUMENTS

2013/0074596 A1* 3/2013 Takizawa .............. B81B 7/0041
                                                29/527.1
2015/0059475 A1* 3/2015 Takagi .................. G01P 15/125
                                                73/514.32
(Continued)

FOREIGN PATENT DOCUMENTS

JP    2013-038674 A      2/2013
JP    2015-004517    *   1/2015
(Continued)

OTHER PUBLICATIONS

English Translation of JP2015-004517.*
English Translation of JP2017-036940.*

*Primary Examiner* — Helen C Kwok
(74) *Attorney, Agent, or Firm* — Harness, Dickey & Pierce, P.L.C.

(57) ABSTRACT

An electronic device includes a substrate, a functional element disposed on a principal plane of the substrate, a lid body, the functional element being housed in a space covered by the lid body and the substrate, the lid body including a recess at a side opposed to the functional element, an outer surface at the opposite side of the recess, a first hole section including an inclined surface and a bottom surface on the outer surface, and a second hole section piercing through the lid body between the recess and the bottom surface and having an inner wall surface, a joining section of the inclined surface and the bottom surface in the first hole section being a curved surface, the lid body containing silicon, and a sealing member that seals the first hole section communicating with the space.

7 Claims, 15 Drawing Sheets

(51) Int. Cl.
  G01P 15/08  (2006.01)
  B60K 35/00  (2006.01)
  G01C 19/5733  (2012.01)
  G01C 19/5769  (2012.01)
  G01P 15/097  (2006.01)
  G01P 15/09  (2006.01)

(52) U.S. Cl.
  CPC .......... *G01C 19/5769* (2013.01); *G01P 1/023* (2013.01); *G01P 3/44* (2013.01); *G01P 15/0802* (2013.01); *B60K 2370/48* (2019.05); *B60Y 2400/303* (2013.01); *G01P 15/0888* (2013.01); *G01P 15/09* (2013.01); *G01P 15/097* (2013.01)

(56) References Cited

U.S. PATENT DOCUMENTS

| | | | | |
|---|---|---|---|---|
| 2015/0313016 | A1* | 10/2015 | Naruse | H05K 1/115 |
| | | | | 73/488 |
| 2016/0138921 | A1* | 5/2016 | Takizawa | B81C 1/00293 |
| | | | | 73/488 |
| 2017/0343351 | A1 | 11/2017 | Tormalehto | |
| 2019/0369137 | A1* | 12/2019 | Naruse | G01P 15/18 |

FOREIGN PATENT DOCUMENTS

| | | | |
|---|---|---|---|
| JP | 2015-004517 | A | 1/2015 |
| JP | 2015-103685 | * | 6/2015 |
| JP | 5999298 | B2 | 9/2016 |
| JP | 2017-036940 | * | 2/2017 |
| JP | 6155885 | B2 | 7/2017 |
| JP | 6252737 | B2 | 12/2017 |
| JP | 6451779 | B2 | 1/2019 |

* cited by examiner

ELECTRONIC DEVICE, MANUFACTURING METHOD FOR ELECTRONIC DEVICE, ELECTRONIC APPARATUS, AND VEHICLE

The present application is based on, and claims priority from JP Application Serial Number 2019-137146, filed Jul. 25, 2019, the disclosure of which is hereby incorporated by reference herein in its entirety.

BACKGROUND

1. Technical Field

The present disclosure relates to an electronic device, a manufacturing method for the electronic device, an electronic apparatus, and a vehicle.

2. Related Art

JP-A-2015-4517 (Patent Literature 1) discloses an electronic device in which a functional element is disposed in a space covered by a substrate and a lid body and a through-hole provided in the lid body is sealed by a sealing member to make it possible to keep the space in an airtight state and maintain stable operation of the functional element.

In the electronic device, the shape of the through-hole provided in the lid body made of silicon is a substantially square-pyramid square hole shape having, as an inner wall, four inclined surfaces inclined at a predetermined angle. Accordingly, in order to prevent a crack along a cleavage plane of silicon from occurring from an angular portion of a joining section of the inclined surfaces of the through-hole because of irradiation of a laser beam or the like when the sealing member is inserted into the through-hole and melted, a corner portion of the joining section of the inclined surfaces is chamfered or rounded by wet etching using an etching solution containing hydrofluoric acid or nitric acid.

However, in the electronic device described in Patent Literature 1, occurrence the crack starting from the cleavage plane can be suppressed but occurrence of a crack starting from the joining section, where the other crystal planes are joined, cannot be suppressed. In particular, when the lid made of silicon is configured from a wafer having a crystal plane (100) as a principal plane, a flat surface parallel to the wafer is always a (100) plane. It is likely that a crack occurs in a joining section of the (100) plane and another crystal plane.

SUMMARY

An electronic device includes: a substrate; a functional element disposed on one surface of the substrate; a lid body, the functional element being housed in a space covered by the lid body and the substrate, the lid body including a first surface at a side opposed to the functional element, a second surface at an opposite side of the first surface, a first hole section including an inclined surface and a bottom surface on the second surface, and a second hole section piercing through the lid body between the first surface and the bottom surface and having an inner wall surface, a joining section of the inclined surface and the bottom surface in the first hole section being a curved surface, the lid body containing silicon; and a sealing member that seals the first hole section communicating with the space.

In the electronic device, a curvature radius of the curved surface may be 5 nm or more and 50 µm or less.

In the electronic device, a joining section of the inclined surface and the second surface may be a curved surface.

In the electronic device, a joining section of the bottom surface and the inner wall surface may be a curved surface.

In the electronic device, a metal film may be disposed on the inclined surface, the bottom surface, and the inner wall surface.

In the electronic device, the metal film may be disposed on the curved surface of the bottom surface and the inner wall surface.

A manufacturing method for an electronic device is a manufacturing method for an electronic device including: a substrate; a functional element disposed on one surface of the substrate; a lid body, the functional element being housed in in a space covered by the lid body and the substrate, the lid body including a first surface at a side opposed to the functional element, a second surface at an opposite side of the first surface, a first hole section including an inclined surface and a bottom surface on the second surface, and a second hole section piercing through the lid body between the first surface and the bottom surface and having an inner wall surface, a joining section of the inclined surface and the bottom surface in the first hole section being a curved surface, the lid body containing silicon; and a sealing member that seals the first hole section communicating with the space, the manufacturing method for the electronic device including a thermal oxidation step in a forming process for the first hole section and the second hole section of the lid body.

In the manufacturing method for an electronic device, the manufacturing method for the electronic device may include a metal film forming step by long slow sputtering in a process for forming a metal film on the inclined surface, the bottom surface, and the inner wall surface.

An electronic apparatus includes the electronic device.

A vehicle includes the electronic device.

DESCRIPTION OF EXEMPLARY EMBODIMENTS

1. First Embodiment

An angular velocity sensor 1, which is one of inertial sensors, is explained as an example of an electronic device.

Figure 1:
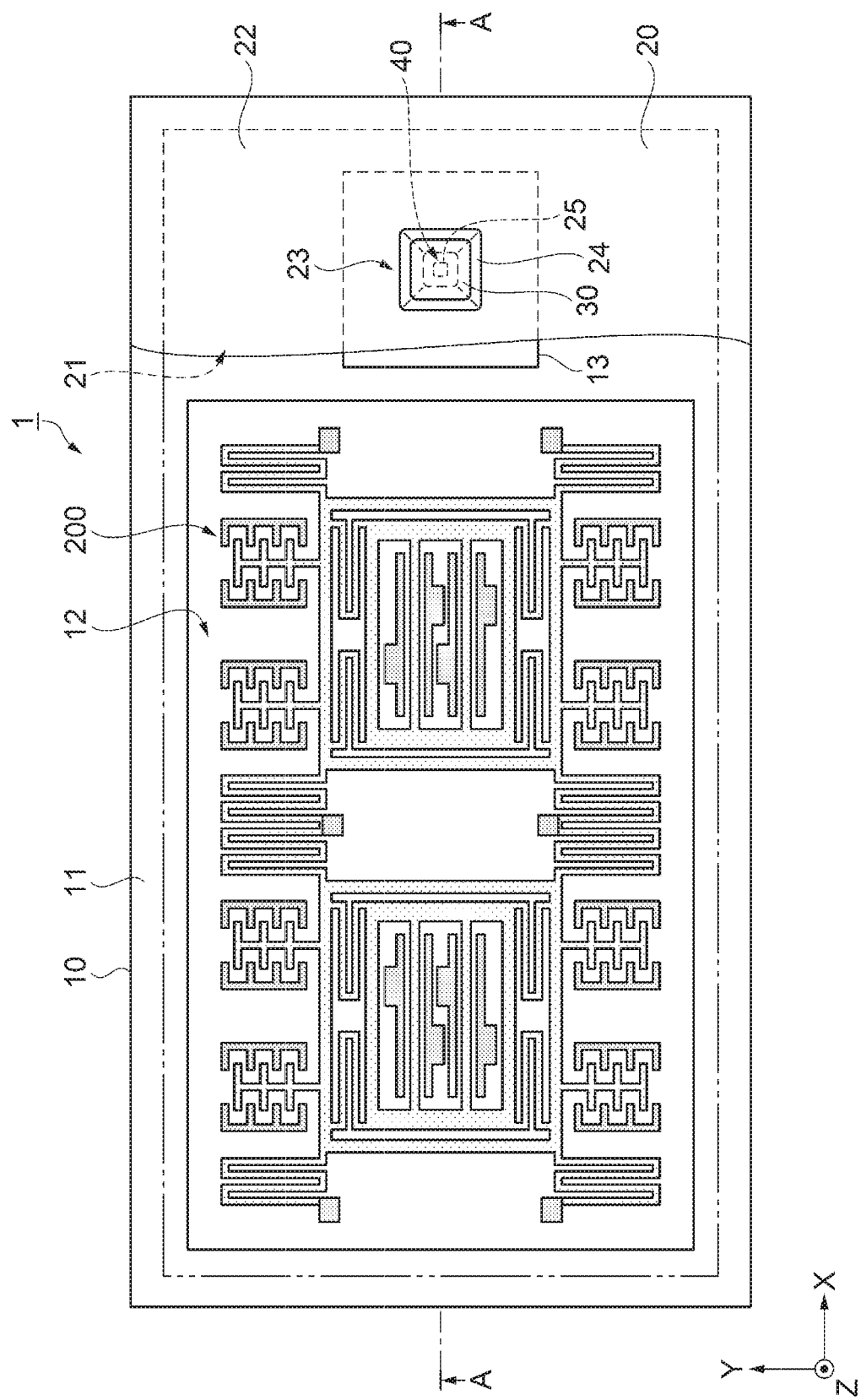
FIG. 1 is a plan view showing a schematic configuration of an electronic device according to a first embodiment.
Figure 2:
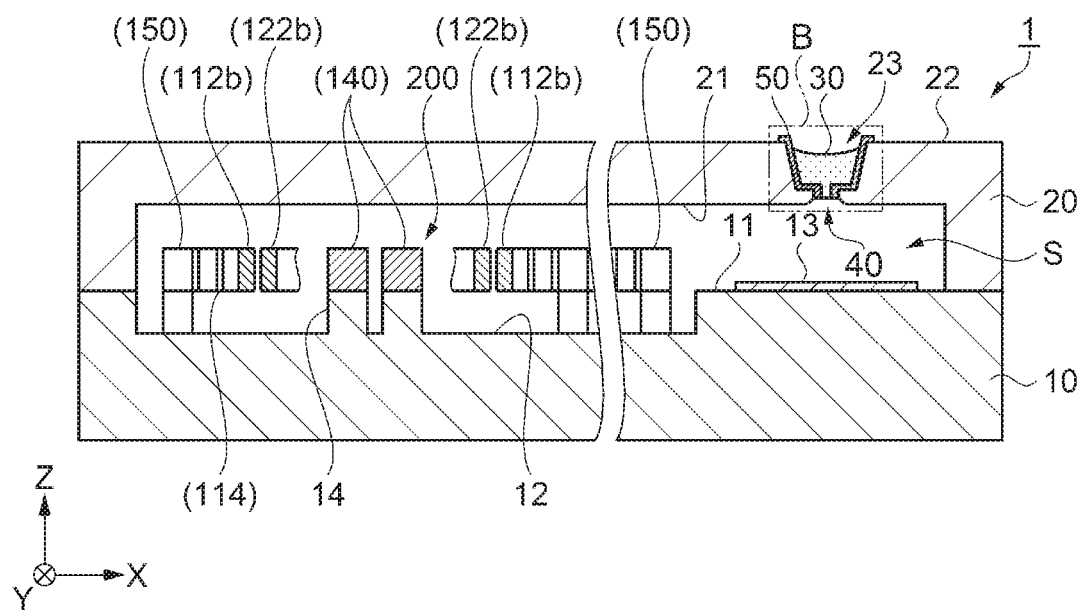
FIG. 2 is a sectional view taken along an A-A line of FIG. 1.
Figure 3:
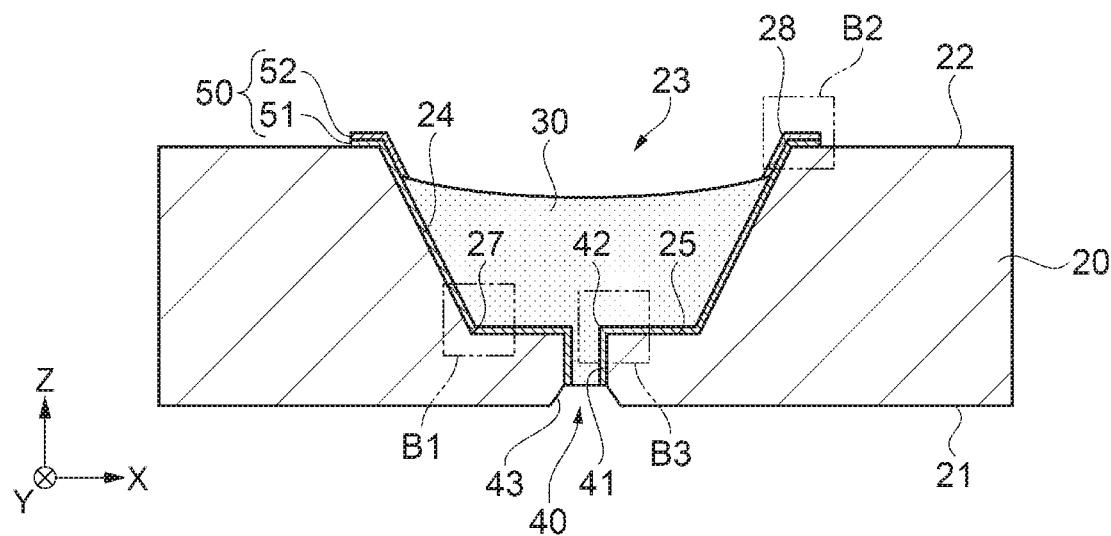
FIG. 3 is an enlarged view of a B part of FIG. 2.
Figure 4:
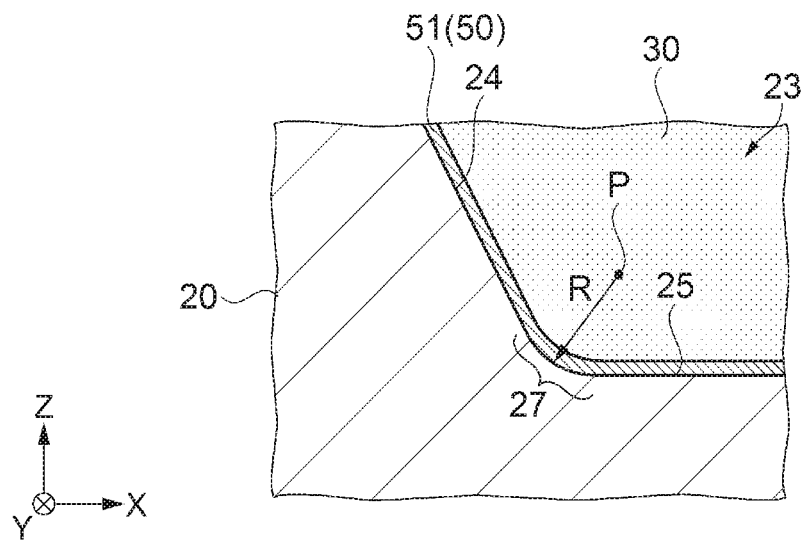
FIG. 4 is an enlarged view of a B1 part of FIG. 3.
Figure 5:
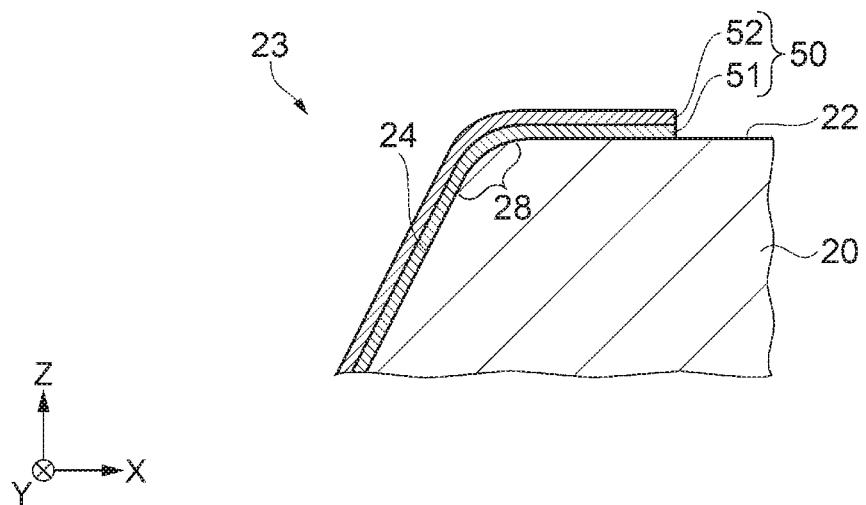
FIG. 5 is an enlarged view of a B2 part of FIG. 3.
Figure 6:
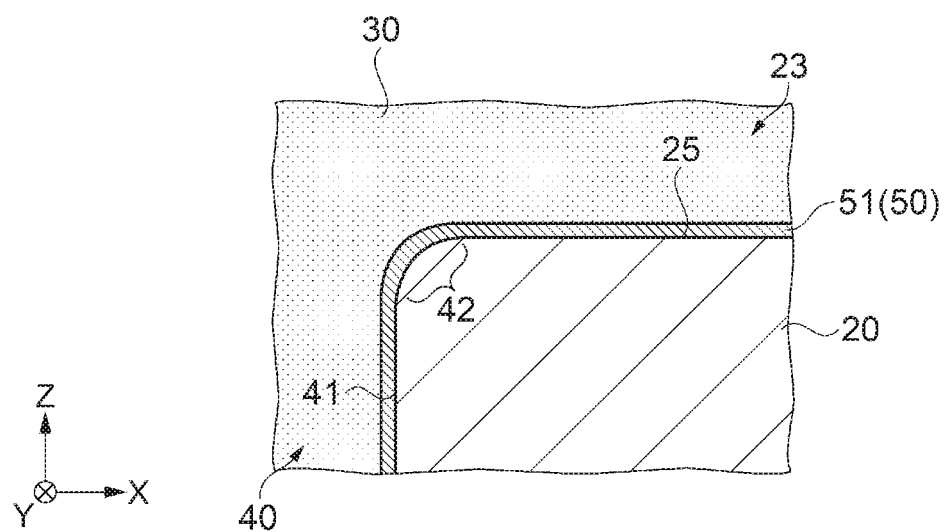
FIG. 6 is an enlarged view of a B3 part of FIG. 3.

FIG. 1 a plan view showing a schematic configuration of the angular velocity sensor 1 according to a first embodiment. FIG. 2 is a sectional view taken along an A-A line of FIG. 1. FIG. 3 is an enlarged view of a B part of FIG. 2. FIG. 4 is an enlarged view of a B1 part of FIG. 3. FIG. 5 is an enlarged view of a B2 part of FIG. 3. FIG. 6 is an enlarged view of a B3 part of FIG. 3. In the figures, for convenience of explanation, illustration of a part of components is omitted. In the figures, to facilitate understanding, dimension ratios of the components are differentiated from actual dimension ratios. An X axis, a Y axis, and a Z axis in the figures are coordinate axes orthogonal to one another. An arrow direction is a +direction.

The angular velocity sensor 1 includes, as shown in FIGS. 1 to 6, a substantially rectangular flat substrate 10, a lid body 20, and a functional element 200 disposed in a space S covered by the substrate 10 and the lid body 20.

The lid body 20 includes a recess 21 functioning as a first surface at a side opposed to the functional element 200 and an outer surface 22 functioning as a second surface on the opposite side of the recess 21. The lid body 20 covers the functional element 200 on the recess 21 side and is airtightly joined to the substrate 10.

The functional element 200 is formed in a shape shown in the figures by photolithography and etching from a not-shown semiconductor substrate disposed on the substrate 10. The functional element 200 functions as a sensor element that detects angular velocity. Details of the functional element 200 including signs in parentheses in FIG. 2 are explained below.

On the substrate 10, a recess 12, a plane shape of which is a substantially rectangular shape, is provided on a principal plane 11, which is one surface opposed to the functional element 200, in order to avoid interference of the functional element 200 and the substrate 10. Consequently, the functional element 200 is fit in the recess 12 in a plan view. Protrusions 14 supporting the functional element 200 are provided in places of the recess 12. The upper surfaces or supporting surfaces of the protrusions 14 are flush with the principal plane 11. The plane shape of the protrusions 14 is substantially the same shape as the shape of supported parts of the functional element 200.

As a constituent material of the substrate 10, it is preferable to use an insulating material such as glass, quartz, or quartz crystal. In particular, when a semiconductor substrate to be formed as the functional element 200 is configured using a semiconductor material such as silicon as a main material, it is preferable to use, as the constituent material of the substrate 10, glass containing an alkali metal ion, for example, borosilicate glass such as Pyrex (registered trademark).

Consequently, in the angular velocity sensor 1, the substrate 10 and the semiconductor substrate can be anodically bonded. In the angular velocity sensor 1, by using the glass containing the alkali metal ion in the substrate 10, the substrate 10 and the semiconductor substrate can be easily insulated and separated. Further, the functional element 200 can be more firmly fixed to the substrate 10 by the anodic bonding. Therefore, the functional element 200 having high stability and high reliability can be provided.

The substrate 10 does not always have insulation and may be, for example, a conductive substrate made of low-resistance silicon. In this case, an insulating film is sandwiched between the substrate 10 and the semiconductor substrate to insulate and separate the substrate 10 and the semiconductor substrate.

It is preferable that a coefficient of thermal expansion difference between the constituent material of the substrate 10 and the constituent material of the semiconductor substrate is as small as possible. Specifically, it is preferable that the coefficient of thermal expansion difference between the constituent material of the substrate 10 and the constituent material of the semiconductor substrate is 3 ppm/° C. or less. Consequently, the angular velocity sensor 1 can reduce residual stress between the substrate 10 and the semiconductor substrate.

It is assumed that glass is used as the main material of the substrate 10.

The lid body 20 contains silicon and includes a first hole section 23 and a second hole section 40 that pierce through the lid body 20 between the recess 21 and the outer surface 22. As shown in FIG. 3, the recess 21 of the lid body 20 is shaved near the second hole section 40 to form a cutout section 43.

The lid body 20 is formed such that a (100) plane of the silicon extend along the outer surface 22.

As shown in FIG. 3, the first hole section 23 and the second hole section 40 are disposed in a position not overlapping the functional element 200 in a plan view from an axial direction.

The first hole section 23 is provided on the outer surface 22 side. The first hole section 23 includes four inclined surfaces 24 that are in contact with the outer surface 22 and a bottom surface 25 that is in contact with the second hole section 40. A plane shape of the first hole section 23 viewed from the Z-axis direction is a substantially square shape. An opening area on the outer surface 22 side is larger than an opening area on the bottom surface 25 side. Since a wafer including a silicon (100) plane is used as the lid body 20, the bottom surface 25 also includes the silicon (100) plane. On the other hand, the inclined surface 24 includes a plane different from the (100) plane.

When the inclined surface 24 is formed on the lid body 20 by an anisotropic wet etching method as explained below, a silicon (111) plane is often formed on the inclined surface 24.

A joining section 27 connecting the inclined surface 24 and the bottom surface 25 of the first hole section 23 is formed as a curved surface as shown in FIG. 4. That is, the inclined surface 24 including the silicon (111) plane and the bottom surface 25 including the silicon (100) plane are connected by the joining section 27 including a gentle curved surface. Accordingly, stress involved in melting and solidification of a sealing member less easily concentrates on the joining section 27. Occurrence of a crack starting from the joining section 27 can be suppressed.

In the curved surface of the joining section 27, a curvature radius R centering on a center point P is set to 5 nm or more and 50 μm or less. This is because, when the curvature radius R is smaller than 5 nm, since the curvature radius R is smaller than ten times of a lattice constant of silicon atoms, it is difficult to form the joining section 27 as a curved surface and, when the curvature radius R is larger than 50 μm, the dimension of the first hole section 23 is increased and the angular velocity sensor 1 is increased in size.

A joining section 28 connecting the inclined surface 24 and the outer surface 22 of the first hole section 23 is formed as a curved surface as shown in FIG. 5. That is, the inclined surface 24 including the silicon (111) plane and the outer surface 22 including the silicon (100) plane are connected by the joining section 28 including a gentle curved surface. Accordingly, even if the melted sealing member 30 overflows from the first hole section 23 and spreads to the outer surface 22, stress involved in melting and solidification of the sealing member 30 less easily concentrates on the joining section 28. Occurrence of a crack starting from the joining section 28 can be suppressed.

The second hole section 40 is provided on the recess 21 side. The second hole section 40 pierces through the lid body 20 between the recess 21 and the bottom surface 25 of the first hole section 23 and includes an inner wall surface 41. The bottom surface 25 includes the silicon (100) plane as explained above. However, a crystal plane of the inner wall surface 41 depends on the shape of the second hole section 40. A shape in a top view of the second hole section 40 may be any shape as long as the second hole section 40 pierces through the lid body 20 and may be a square, a triangle, or a polygon or may be a circle or an ellipse. If the shape of the inner wall surface 41 is a square and the inner wall surface 41 is orthogonal to a crystal axis, the inner wall surface 41 includes a silicon (100) plane. In other cases, the inner wall surface 41 does not include a crystal plane and has an axis parallel to a crystal axis <100>.

A joining section 42 that connects the bottom surface 25 of the first hole section 23 and the inner wall surface 41 of the second hole section 40 is formed as a curved surface as shown in FIG. 6. Accordingly, stress involved in melting and solidification of the sealing member less easily concentrates on the joining section 42. Occurrence of a crack starting from the joining section 42 can be suppressed.

Since the first hole section 23 and the second hole section 40 communicate, the space S can be kept in an airtight state by continuously filling and sealing the second hole section 40 with the sealing member 30 in the same manner as filling and sealing the first hole section 23.

A metal film 50 is provided on the inclined surface 24 and the bottom surface 25 of the first hole section 23, the inner wall surface 41, and the curved surfaces of the joining sections 27, 28, and 42 in the order of a first layer 51 and a second layer 52 from the lid body 20 side to make the sealing member 30 easily wet and spread. The metal film 50 in contact with the melted sealing member 30 includes only the first layer 51 as shown in FIGS. 3, 4, and 6 because the second layer 52 diffuses in the melted sealing member 30.

As a constituent material of the metal film 50, TiW can be suitably used for the first layer 51 and Au can be suitably used for the second layer 52. The first layer 51 adheres to the lid body 20 and has a function of a barrier film such that the first layer 51 does not diffuse to the lid body 20 side. When the lid body 20 is made of a silicon material, the first layer 51 may be a thin film of Ti, TiN, Cr, or the like besides TiW. As the second layer 52, a material adhering to the sealing member 30 is desirable. Alternatively, a material forming a satisfactory alloy with the sealing member 30 is desirable. When an alloy including Au is used for the sealing member 30 as explained below, a material containing Au is used for the second layer 52.

The first hole section 23 and the second hole section 40 are sealed by the sealing member 30.

Specifically, after the lid body 20 is airtightly bonded to the principal plane 11 of the substrate 10 using, for example, an anodic bonding method, a bonding method by a bonding member, or a direct bonding method, gas in the space S including the recess 12 of the substrate 10 and the recess 21 of the lid body 20 is discharged by a vacuum chamber or the like.

The sealing member 30 is placed in the first hole section 23 from the outer surface 22 side. A laser beam, an electron beam, or the like is irradiated on the sealing member 30. The melted sealing member 30 spreads to the insides of the first hole section 23 and the second hole section 40. The first hole section 23 and the second hole section 40 are sealed.

Consequently, the space S is kept in a vacuum state.

A constituent material of the sealing member 30 is not particularly limited. However, an Au—Ge alloy, an Au—Sn alloy, a Pb—Ag alloy, and the like can be suitably used.

It is preferable that, for example, a metal film 13 containing Au or the like is formed in a position on the principal plane 11 of the substrate 10 opposed to the second hole section 40.

The configuration of the functional element 200 is explained.

Figure 7:
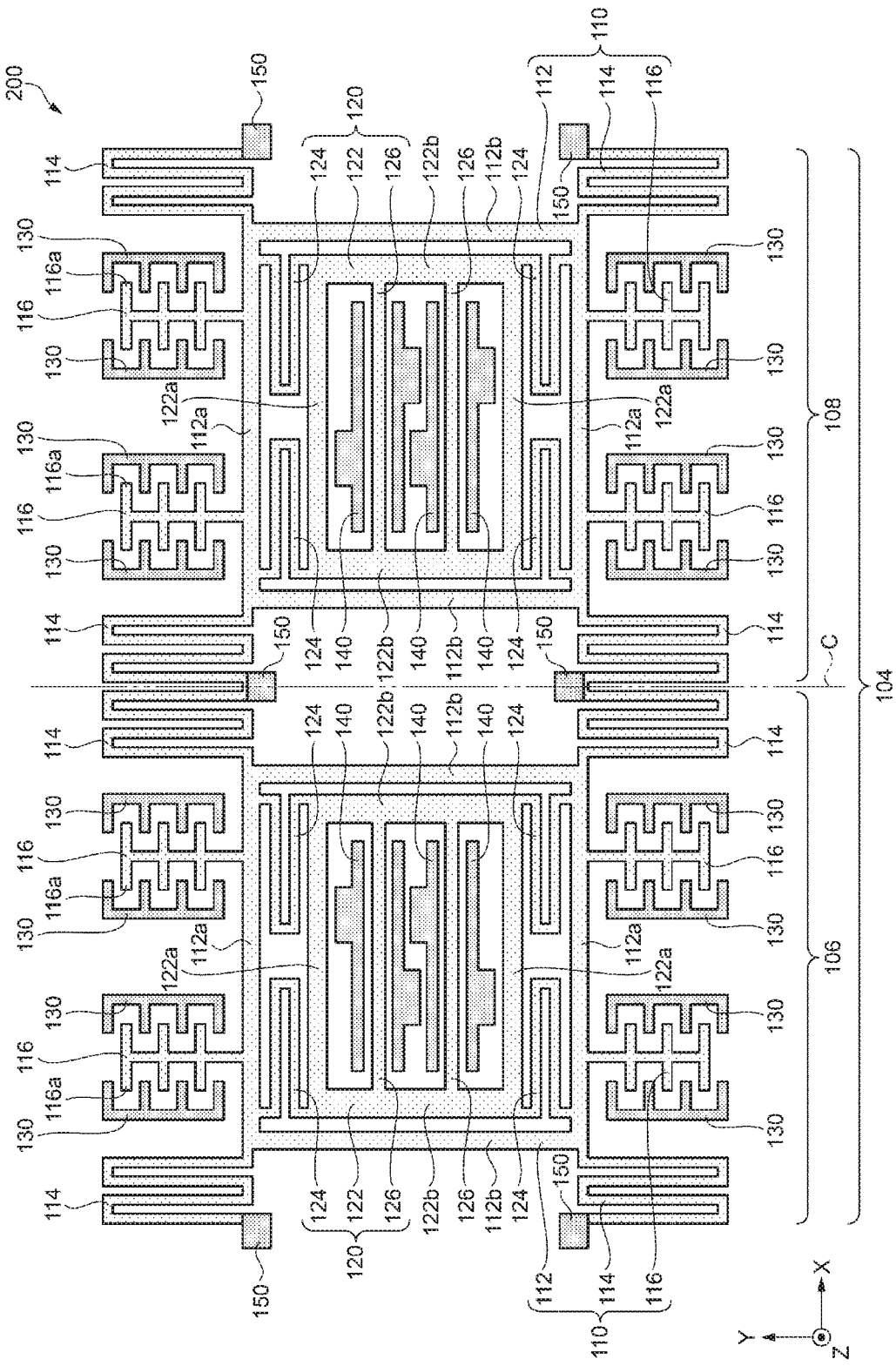
FIG. 7 is a plan view showing a schematic configuration of a functional element.

FIG. 7 is a schematic plan view showing a schematic configuration of the functional element 200.

The functional element 200 includes, as shown in FIG. 7, a vibration system structure 104, fixed electrodes for driving 130, fixed electrodes for detection 140, and fixed sections 150.

The components described above such as the vibration system structure 104 is integrally formed by, as explained above, etching a semiconductor substrate such as one silicon bonded to the substrate 10. Consequently, it is possible to apply a micro machining technique used for manufacturing of a silicon semiconductor device. A reduction in the size of the functional element 200 can be achieved.

The fixed electrodes for driving 130, the fixed electrodes for detection 140, and the fixed sections 150 are fixed to the protrusions 14 of the substrate 10 shown in FIG. 2.

The vibration system structure 104 is supported by the fixed sections 150 and disposed to have a space between the vibration system structure 104 and the recess 12 of the substrate 10.

The vibration system structure 104 includes a first vibrating body 106 and a second vibrating body 108. The first vibrating body 106 and the second vibrating body 108 are coupled to each other along the X axis.

It is preferable that the first vibrating body 106 and the second vibrating body 108 are formed in a shape symmetrical with respect to a boundary line C between the first vibrating body 106 and the second vibrating body 108, which is a straight line along the Y axis. Therefore, in the following explanation, the configuration of the first vibrating body 106 is explained. Explanation is omitted about the configuration of the second vibrating body 108.

The first vibrating body 106 includes a driving section 110 and a detecting section 120. The driving section 110 includes a supporting section for driving 112, spring sections for driving 114, and movable electrodes for driving 116.

The supporting section for driving 112 has, for example, a frame-like shape. The detecting section 120 is disposed on the inner side of the supporting section for driving 112. In an example shown in FIG. 7, the supporting section for driving 112 includes a pair of first extending sections 112a extending along the X axis and a pair of second extending sections 112b extending along the Y axis.

The spring sections for driving 114 are disposed on the outer side of the supporting section for driving 112. In the example shown in FIG. 7, one ends of the spring sections for driving 114 are connected to the vicinities of corner sections, which are connecting sections of the first extending sections 112a and the second extending sections 112b of the supporting section for driving 112. The other ends of the spring sections for driving 114 are connected to the fixed sections 150.

In the example shown in FIG. 7, four spring sections for driving 114 are provided in the first vibrating body 106. Consequently, the first vibrating body 106 is supported by four fixed sections 150. The fixed sections 150 on the boundary line C between the first vibrating body 106 and the second vibrating body 108 may not be provided.

The spring sections for driving 114 have a shape extending along the X axis while being turned back and forth along the Y axis. The plurality of spring sections for driving 114 are provided symmetrically with respect to a not-shown imaginary line along the X axis passing the center of the supporting section for driving 112 and a not-shown imaginary line along the Y axis passing the center of the supporting section for driving 112.

By forming the spring sections for driving 114 in the shape explained above, the spring sections for driving 114 can be suppressed from being deformed in the Y-axis direction and the Z-axis direction. The spring sections for driving 114 can be smoothly extended and contracted in the X-axis direction, which is a vibrating direction of the driving section 110. The supporting section for driving 112 can be vibrated along the X axis according to the extension and contraction of the spring sections for driving 114. The number of the spring sections for driving 114 is not particularly limited if the supporting section for driving 112 can be vibrated along the X axis.

The movable electrodes for driving 116 are disposed to be connected to the supporting section for driving 112 on the outer side of the supporting section for driving 112. More specifically, the movable electrodes for driving 116 are respectively connected to the pair of first extending sections 112a of the supporting section for driving 112.

The fixed electrodes for driving 130 are disposed on the outer side of the supporting section for driving 112. The fixed electrodes for driving 130 are fixed on the substrate 10. In the example shown in FIG. 7, a plurality of fixed electrodes for driving 130 are provided and disposed to be opposed via the movable electrodes for driving 116.

In the example shown in FIG. 7, the fixed electrodes for driving 130 have a comb teeth-like shape. The movable electrodes for driving 116 include projecting sections 116a that can be inserted among the comb teeth of the fixed electrodes for driving 130.

In the functional element 200, by reducing the distance between the fixed electrodes for driving 130 and the projecting sections 116a, an electrostatic force acting between the fixed electrodes for driving 130 and the movable electrodes for driving 116 can be increased.

When a voltage is applied between the fixed electrodes for driving 130 and the movable electrodes for driving 116, an electrostatic force can be generated between the fixed electrodes for driving 130 and the movable electrodes for driving 116. Consequently, it is possible to vibrate the supporting section for driving 112 along the X axis while extending and contracting the spring sections for driving 114 along the X axis. At this time, efficiency of vibration is improved by setting the vibration system structure 104 in a decompressed atmosphere or vacuum state, in particular, to 10 Pa or less.

In the example shown in FIG. 7, four movable electrodes for driving 116 are provided in the first vibrating body 106. However, the number of the movable electrodes for driving 116 is not particularly limited if the supporting section for driving 112 can be vibrated along the X axis. In the example shown in FIG. 7, the fixed electrodes for driving 130 are disposed to be opposed via the movable electrodes for driving 116. However, the fixed electrodes for driving 130 may be disposed only on one side of the movable electrodes for driving 116 if the supporting section for driving 112 can be vibrated along the X axis.

The detecting section 120 is coupled to the driving section 110. In the example shown in FIG. 7, the detecting section 120 is disposed on the inner side of the supporting section for driving 112. The detecting section 120 includes a supporting section for detection 122, spring sections for detection 124, and movable electrodes for detection 126. Although not shown in FIG. 7, the detecting section 120 may be disposed on the outer side of the supporting section for driving 112 if the detecting section 120 is coupled to the driving section 110.

The supporting section for detection 122 has, for example, a frame-like shape. In the example shown in FIG. 7, the supporting section for detection 122 includes a pair of third extending sections 122a extending along the X axis and a pair of fourth extending sections 122b extending along the Y axis.

The spring sections for detection 124 are disposed on the outer side of the supporting section for detection 122. The spring sections for detection 124 connect the supporting section for detection 122 and the supporting section for driving 112. More specifically, one ends of the spring sections for detection 124 are connected to the vicinities of corner sections, which are connecting sections of the third extending sections 122a and the fourth extending sections 122b of the supporting section for detection 122. The other ends of the spring sections for detection 124 are connected to the first extending sections 112a of the supporting section for driving 112.

The spring sections for detection 124 has a shape extending along the Y axis while turning back and forth along the X axis. In the example shown in FIG. 7, four spring sections for detection 124 are provided in the first vibrating body 106. The plurality of spring sections for detection 124 are provided symmetrically with respect to a not-shown imaginary line along the X axis passing the center of the supporting section for detection 122 and a not-shown imaginary line along the Y axis passing the center of the supporting section for detection 122.

By forming the spring sections for detection 124 in the shape explained above, the spring sections for detection 124 is suppressed from being deformed in the X-axis direction and the Z-axis direction. The spring sections for detection 124 can be smoothly extended and contracted in the Y-axis direction, which is a vibrating direction of the detecting section 120. The supporting section for detection 122 can be displaced along the Y axis according to the extension and contraction of the spring sections for detection 124. The number of the spring sections for detection 124 is not particularly limited if the supporting section for detection 122 can be displaced along the Y axis.

The movable electrodes for detection 126 are disposed to be coupled to the supporting section for detection 122 on the inner side of the supporting section for detection 122. In the example shown in FIG. 7, the movable electrodes for detection 126 extend along the X axis and connected between the pair of fourth extending sections 122b of the supporting section for detection 122.

The fixed electrodes for detection 140 are disposed on the inner side of the supporting section for detection 122. The fixed electrodes for detection 140 are fixed on the principal plane 11 of the substrate 10. In the example shown in FIG. 7, a plurality of the fixed electrodes for detection 140 are provided and disposed to be opposed via the movable electrodes for detection 126.

The numbers and the shapes of the movable electrodes for detection 126 and the fixed electrodes for detection 140 are not particularly limited if a change in capacitance between the movable electrodes for detection 126 and the fixed electrodes for detection 140 can be detected.

The operation of the functional element 200 is explained.

FIGS. 8 to 11 are schematic plan views for explaining the operation of the functional element 200. For convenience of explanation, in FIGS. 8 to 11, portions of the functional element 200 are simplified and shown.

When a voltage is applied to the fixed electrodes for driving 130 and the movable electrodes for driving 116 by a not-shown power supply, an electrostatic force is generated between the fixed electrodes for driving 130 and the movable electrodes for driving 116.

Figure 8:
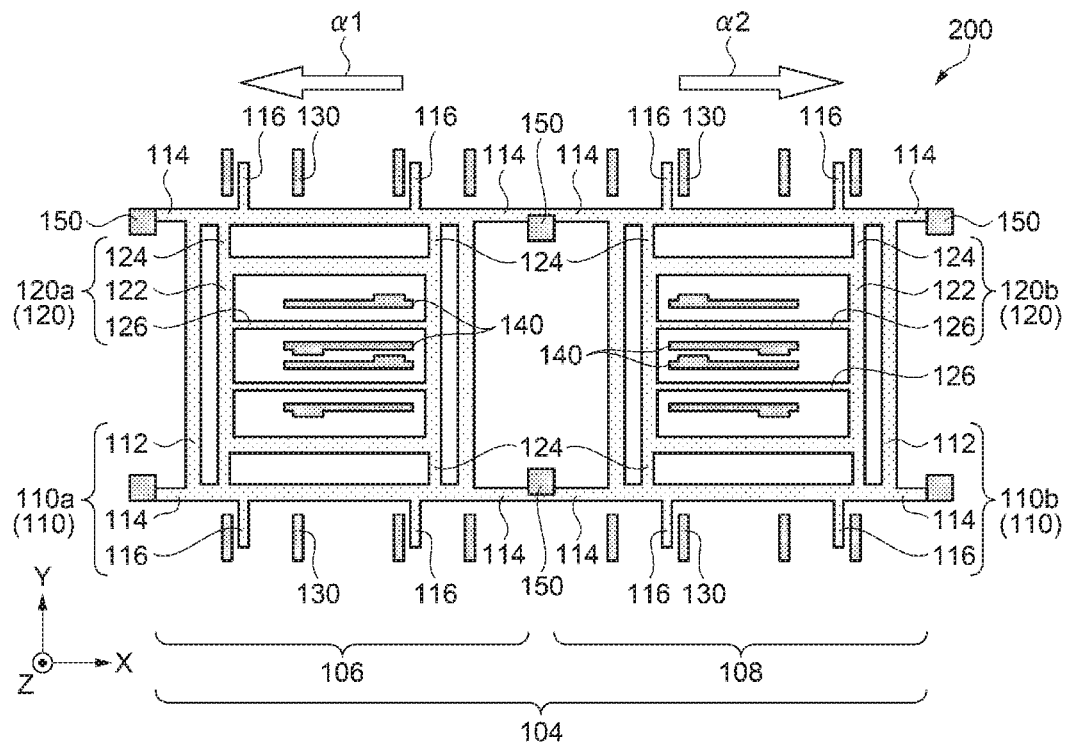
FIG. 8 is a plan view for explaining the operation of the functional element.
Figure 9:
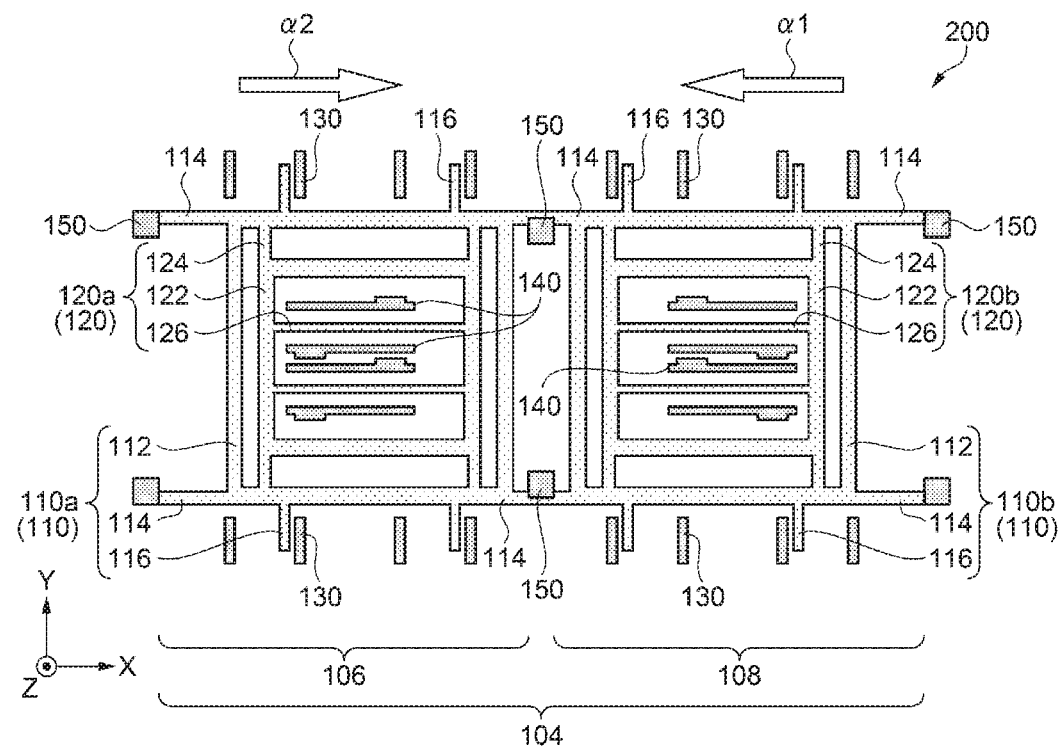
FIG. 9 is a plan view for explaining the operation of the functional element.

Consequently, as shown in FIGS. 8 and 9, the spring sections for driving 114 extend and contract along the X axis and the driving section 110 vibrates along the X axis.

More specifically, a first alternating voltage is applied between the movable electrodes for driving 116 and the fixed electrodes for driving 130 of the first vibrating body 106. A second alternating voltage phase-shifted by 180 degrees from the first alternating voltage is applied between the movable electrodes for driving 116 and the fixed electrodes for driving 130 of the second vibrating body 108.

Consequently, a first driving section 110a of the first vibrating body 106 and a second driving section 110b of the second vibrating body 108 vibrate along the X axis in opposite phases each other and at a predetermined frequency. That is, the first driving section 110a and the second driving section 110b coupled to each other along the X axis vibrate in opposite phases each other along the X axis.

In an example shown in FIG. 8, the first driving section 110a is displaced in an α1 direction and the second driving section 110b is displaced in an α2 direction, which is the opposite direction of the α1 direction. In an example shown in FIG. 9, the first driving section 110a is displaced in the α2 direction and the second driving section 110b is displaced in the α1 direction.

Since the detecting section 120 is coupled to the driving section 110, the detecting section 120 also vibrates along the X axis according to the vibration of the driving section 110. That is, the first vibrating body 106 and the second vibrating body 108 are displaced in opposite directions each other along the X axis.

In this way, the functional element 200 vibrates along the X axis by alternately repeating the states shown in FIGS. 8 and 9.

Figure 10:
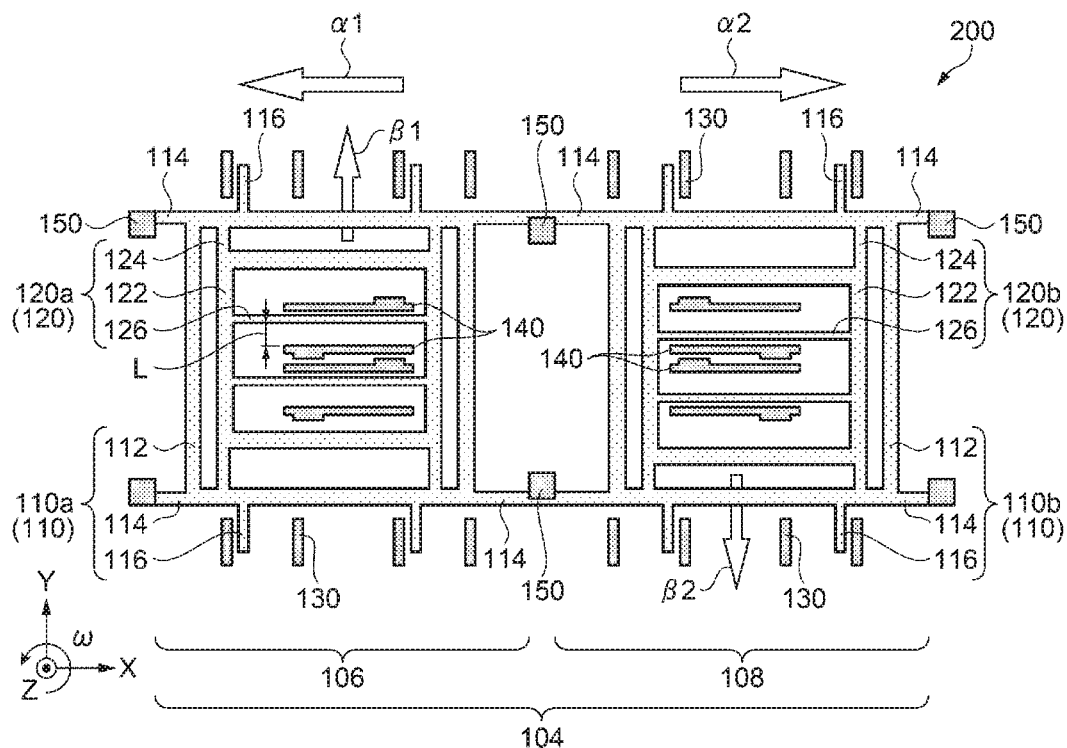
FIG. 10 is a plan view for explaining the operation of the functional element.
Figure 11:
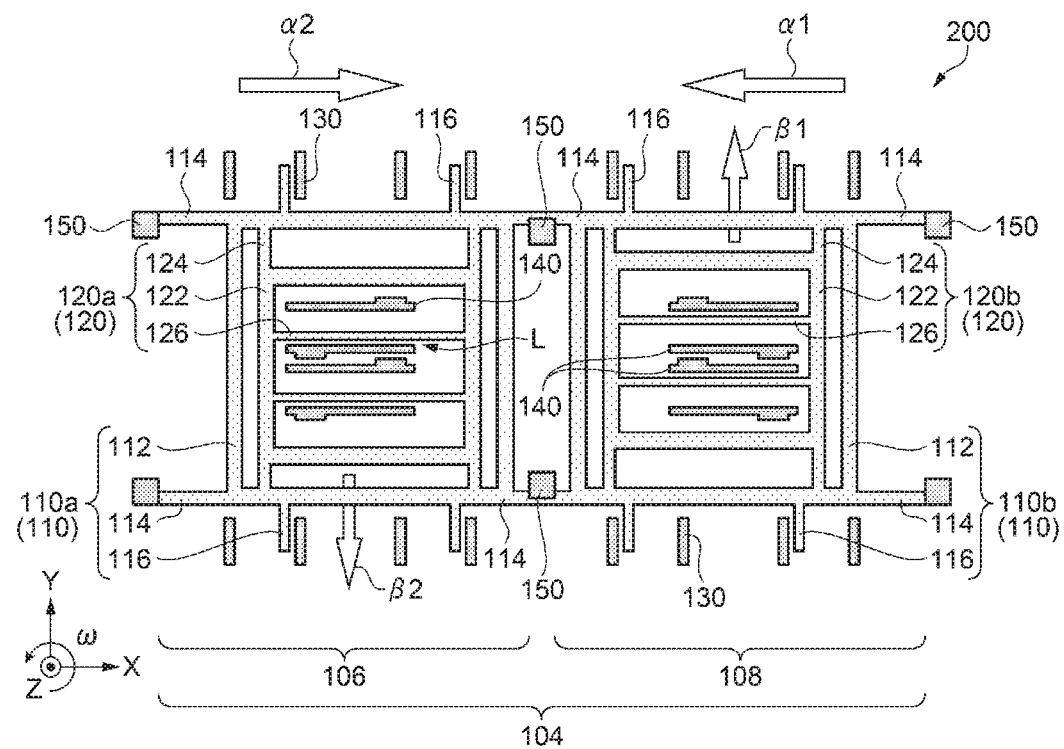
FIG. 11 is a plan view for explaining the operation of the functional element.

As shown in FIGS. 10 and 11, when the first driving section 110a and the second driving section 110b are in the vibration state explained above and angular velocity ω around the Z axis is applied to the functional element 200, a Coriolis force acts and the detecting section 120 is displaced along the Y axis. That is, a first detecting section 120a coupled to the first driving section 110a and a second detecting section 120b coupled to the second driving section 110b are displaced in opposite directions each other along the Y axis by the vibration and the Coriolis force explained above.

In an example shown in FIG. 10, the first detecting section 120a is displaced in a β1 direction and the second detecting section 120b is displaced in a β2 direction, which is the opposite direction of the β1 direction.

In an example shown in FIG. 11, the first detecting section 120a is displaced in the β2 direction and the second detecting section 120b is displaced in the β1 direction.

In this way, the detecting section 120 vibrates along the Y axis by alternately repeating the states shown in FIGS. 10 and 11.

In the functional element 200, the first detecting section 120a and the second detecting section 120 are displaced along the Y axis, whereby a distance L between the movable electrodes for detection 126 and the fixed electrodes for detection 140 changes and the capacitance between the movable electrodes for detection 126 and the fixed electrodes for detection 140 changes.

Consequently, the functional element 200 can calculate the angular velocity ω around the Z axis by detecting a change amount of the capacitance between the movable electrodes for detection 126 and the fixed electrodes for detection 140.

In the above explanation, a form by an electrostatic driving scheme for driving the driving section 110 with an electrostatic force is explained. However, a method of driving the driving section 110 is not particularly limited. A piezoelectric driving scheme, an electromagnetic driving scheme using a Lorentz force of a magnetic field, and the like can be applied.

As explained above, in the angular velocity sensor 1 in this embodiment, the joining section 27 connecting the substrate 10 and the inclined surface 24 and the bottom surface 25 of the first hole 23 provided in the lid body 20 forming the space S in which the functional element 200 is housed, the joining section 28 connecting the inclined surface 24 of the first hole section 23 and the outer surface 22 of the lid body 20, and the joining section 42 connecting the bottom surface 25 of the first hole section 23 and the inner wall surface 41 of the second hole section 40 are curved surfaces. Accordingly, stress involved in melting and solidification of the sealing member 30 less easily concentrates on the joining sections 27, 28, and 42. Cracks starting from the joining sections 27, 28, and 42 can be suppressed. Since residual stress less easily concentrates on the joining sections 27, 28, and 42, cracks caused by a thermal shock and the like can also be suppressed.

As a result, the angular velocity sensor 1 is capable of keeping the space S formed by the substrate 10 and the lid body 20 in the airtight state. Stable operation of the functional element 200 can be maintained. Deficiencies such as deterioration of the functional element 200 due to contact with outside air can be suppressed.

Since the curvature radius R of the curved surface of the joining section 27 is 5 nm or more and 50 µm or less, stress involved in melting and solidification of the sealing member 30 less easily concentrates on the joining section 27. Occurrence of a crack starting from the joining section 27 can be suppressed.

Since the metal film 50 is disposed on the curved surfaces of the inclined surface 24 and the bottom surface 25 of the first hole section 23, the inner wall surface 41 of the second hole section 40, and the joining section 42 connecting the bottom surface 25 and the inner wall surface 41, the melted sealing member 30 can be easily wet and spread in the first hole section 23 and the second hole section 40. Accordingly, the space S formed by the substrate 10 and the lid body 20, in which the functional element 200 is housed, can be kept in the airtight state.

In this embodiment, the functional element 200 is explained using the angular velocity sensor 1, which is one of inertial sensors. However, as explained below, the functional element 200 may be another inertial sensor. There is an acceleration sensor as another inertial sensor that requires airtightness. When the functional element 200 is the acceleration sensor, the space S is in a state close to the atmospheric pressure and airtightness of the space S is secured.

It is known that the acceleration sensor causes an operation failure because of the presence of water. It is necessary to seal the acceleration sensor at the atmospheric pressure while removing moisture in the atmosphere.

Subsequently, an example of a manufacturing method for the angular velocity sensor 1 is explained.

Figure 12:
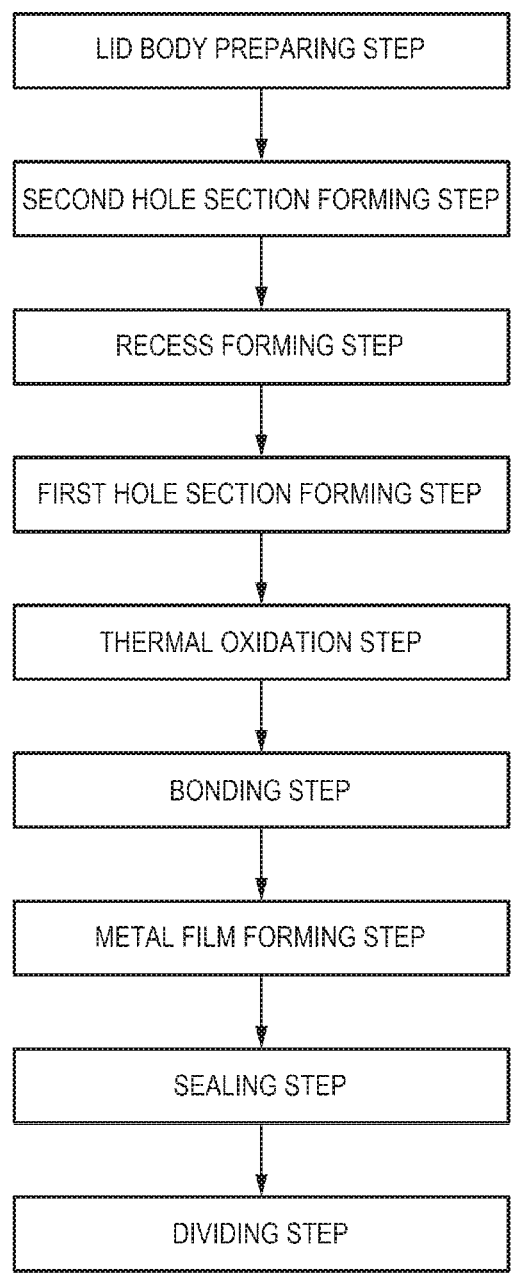
FIG. 12 is a flowchart showing a main manufacturing process for an angular velocity sensor.

FIG. 12 is a flowchart showing a main manufacturing process for the angular velocity sensor 1. FIGS. 13A to 13K are sectional views for explaining a main manufacturing process for the lid body 20. FIGS. 14A to 14E are sectional views for explaining the main manufacturing process for the angular velocity sensor 1.

As shown in FIG. 12, the manufacturing method for the angular velocity sensor 1 includes a lid body preparing step, a second hole section forming step, a recess forming step, a first hole section forming step, a thermal oxidation step, a bonding step, a metal film forming step, a sealing step, and a dividing step.

1.1 Lid Body Preparing Step

Figure 13A:
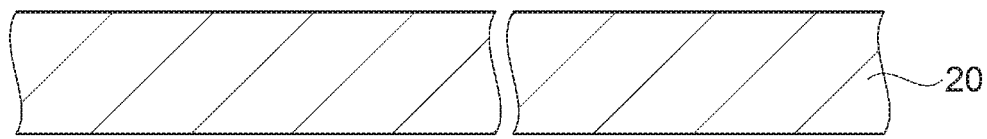
FIG. 13A is a sectional view for explaining a main manufacturing process for a lid body.

First, as shown in FIG. 13A, a silicon substrate, which is the lid body 20 before machining multi-patterned and formed in a flat wafer shape is prepared. It is preferable that the silicon substrate has crystal orientation of a (110) plane.

1.2 Second Hole Section Forming Step

Figure 13B:
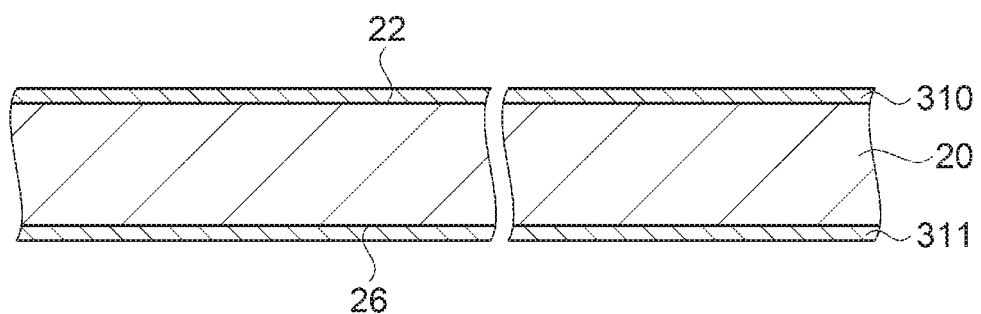
FIG. 13B is a sectional view for explaining the main manufacturing process for the lid body.

Subsequently, as shown in FIG. 13B, etching protection films 310 and 311 are formed over the entire surfaces on the outer surface 22 side of the lid body 20 and a joining surface 26 side to the substrate 10. The etching protection films 310 and 311 may be oxide films of $SiO_2$ or the like formed by thermally oxidizing the surface of silicon. As the film thickness of the oxide film, as an example, approximately 800 nm is assumed.

Figure 13C:
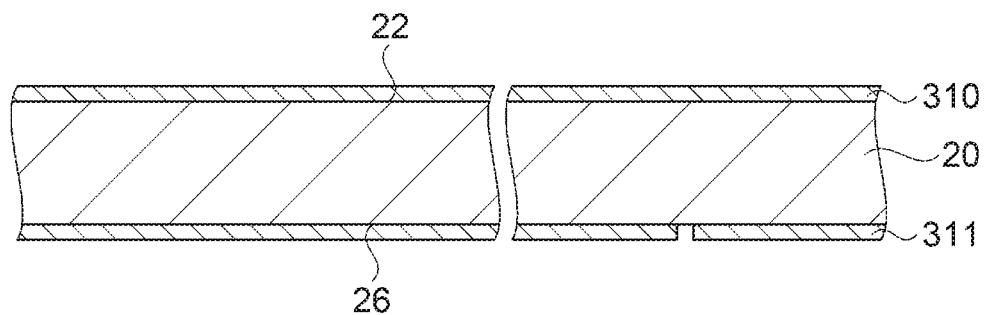
FIG. 13C is a sectional view for explaining the main manufacturing process for the lid body.

Subsequently, as shown in FIG. 13C, the etching protection film 311 on the joining surface 26 side is patterned according to the plane shape of the second hole section 40 using a photolithography technique or the like by a not-shown resist.

Figure 13D:
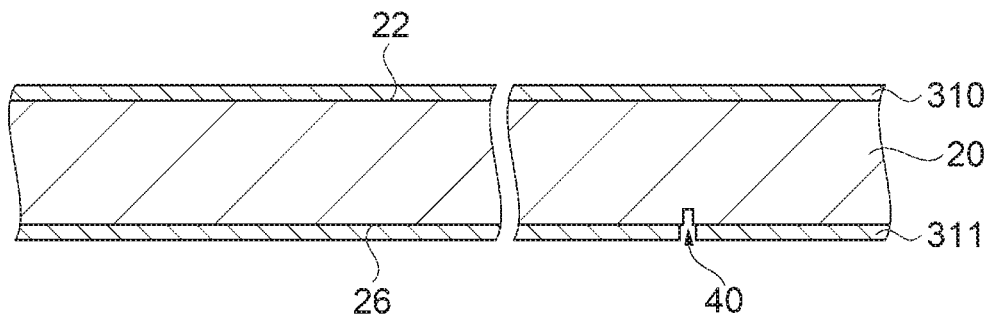
FIG. 13D is a sectional view for explaining the main manufacturing process for the lid body.

Subsequently, as shown in FIG. 13D, the shape of the second hole section 40 is formed by dry etching using an etching gas such as an $SF_6$ gas.

In this case, since the dry etching is used, the inner wall surface 41 of the second hole section 40 is formed substantially perpendicularly to the joining surface 26 without being affected by, for example, a direction of a crystal plane of silicon.

1.3 Recess Forming Step

Figure 13E:
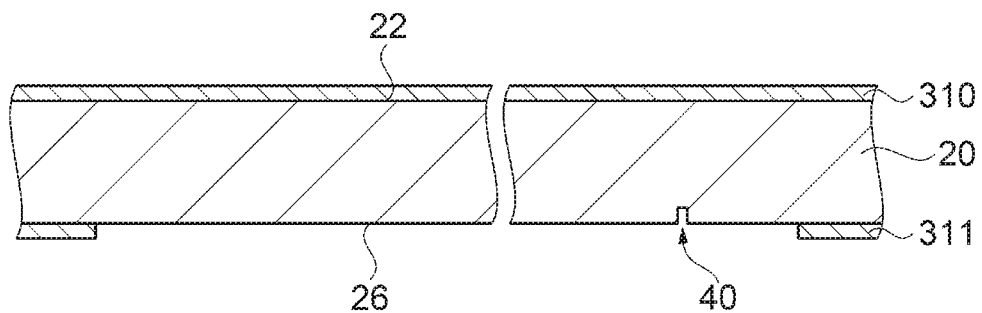
FIG. 13E is a sectional view for explaining the main manufacturing process for the lid body.

Subsequently, as shown in FIG. 13E, the etching protection film 311 on the joining surface 26 side is patterned according to the plane shape of the recess 21 using the photolithography technique or the like by a not-shown resist.

Figure 13F:
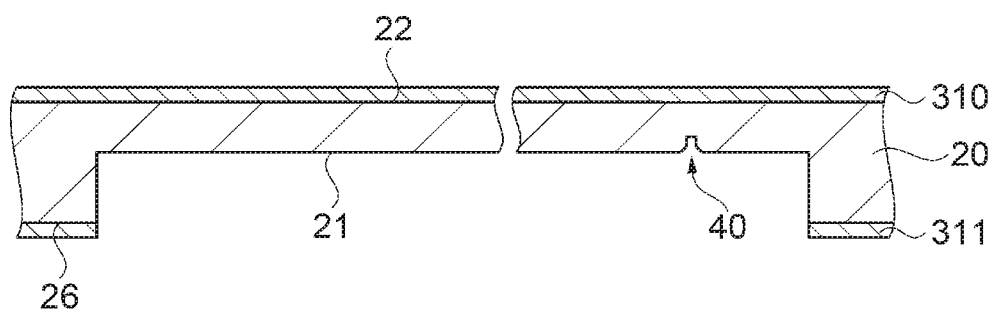
FIG. 13F is a sectional view for explaining the main manufacturing process for the lid body.

Subsequently, as shown in FIG. 13F, the shape of the recess 21 is formed by dry etching using an etching gas such as an $SF_6$ gas. At this time, the cutout section 43 is formed at the distal end portion of the second hole section 40. This is because an etching rate at corner sections are higher compared with the other parts during the dry etching. That is, the distal end portion of the second hole section 40 has a cutout shape.

Figure 13G:
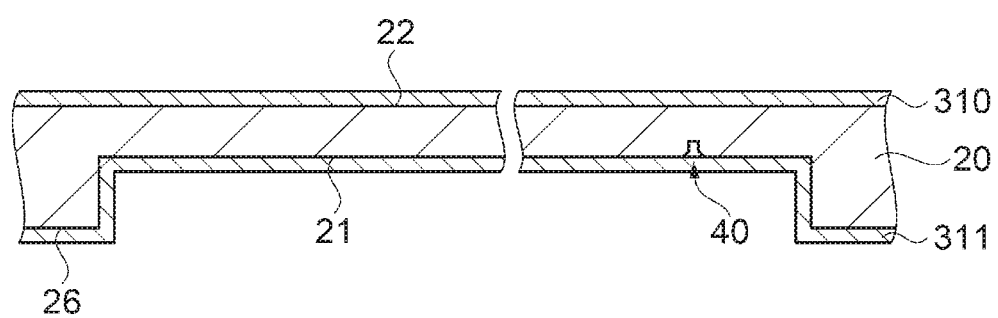
FIG. 13G is a sectional view for explaining the main manufacturing process for the lid body.

Subsequently, after the etching protection films 310 and 311 are peeled once, as shown in FIG. 13G, the etching protection films 310 and 311 are formed again over the entire surface on the outer surface 22 side and the recess 21 side and the joining surface 26 side.

Figure 13H:
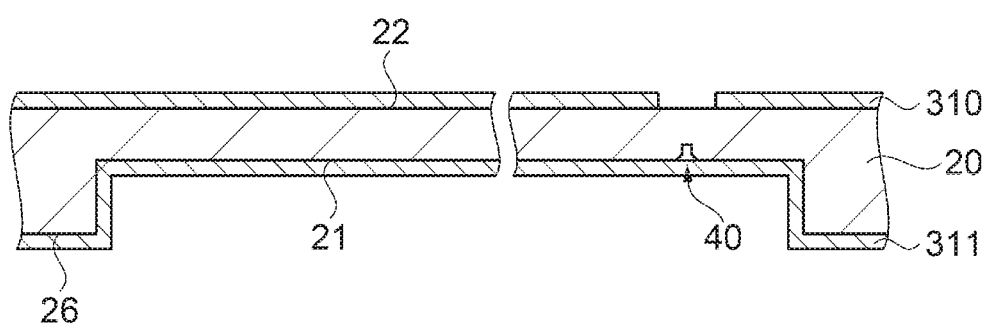
FIG. 13H is a sectional view for explaining the main manufacturing process for the lid body.

Subsequently, as shown in FIG. 13H, the etching protection film 310 on the outer surface 22 side is patterned according to the plane shape of the first hole section 23 using the photolithography technique or the like by a not-shown resist.

In this case, it is preferable to protect the etching protection film 311 on the recess 21 side and the joining surface 26 side with a not-shown protection tape or the like not to be etched together with the etching protection film 310.

1.4 First Hole Section Forming Step

Figure 13J:
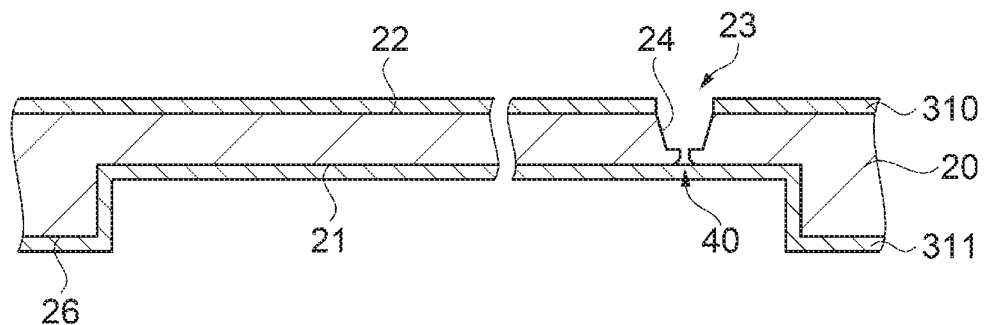
FIG. 13J is a sectional view for explaining the main manufacturing process for the lid body.

Subsequently, as shown in FIG. 13J, the shape of the first hole section 23 is formed by wet etching using an etching solution such as a KOH (potassium hydroxide) water solution.

In this case, with an anisotropic etching characteristic of the etching solution containing KOH and a property of silicon, the inner wall of the first hole section 23 is formed by four inclined surfaces 24 inclined such that an opening area on the outer surface 22 side is larger than an opening area on the recess 21 side, in other words, the first hole section 23 narrows downward in the direction in the drawing. The four inclined surfaces 24 are formed along a silicon (111) plane. Consequently, the four inclined surfaces 24 and the bottom surface 25 of the first hole section 23 are formed. Since a wafer including a silicon (100) plane is used as the lid body 20, the bottom surface 25 also includes the (100) plane.

The etching is performed until the bottom surface 25 of the first hole section 23 and the second hole section 40 communicate. The inner wall surface 41 of the second hole section 40 is formed substantially perpendicularly to the bottom surface 25 of the first hole section 23.

1.5 Thermal Oxidation Step

Subsequently, when thermal oxidation is performed in a state shown in FIG. 13J, the inner walls of the first hole section 23 and the second hole section 40 are oxidized. An oxide film is formed on the surfaces of the inner walls. In the thermal oxidation, an $H_2$ gas and an $O_2$ gas may be used. When such thermal oxidation treatment is performed, the joining section 27 connecting the inclined surface 24 and the bottom surface 25 of the first hole section 23, the joining section 28 connecting the inclined surface 24 and the outer surface 22, and the joining section 42 connecting the bottom surface 25 and the inner wall surface 41 can be formed as curved surfaces.

Figure 13K:
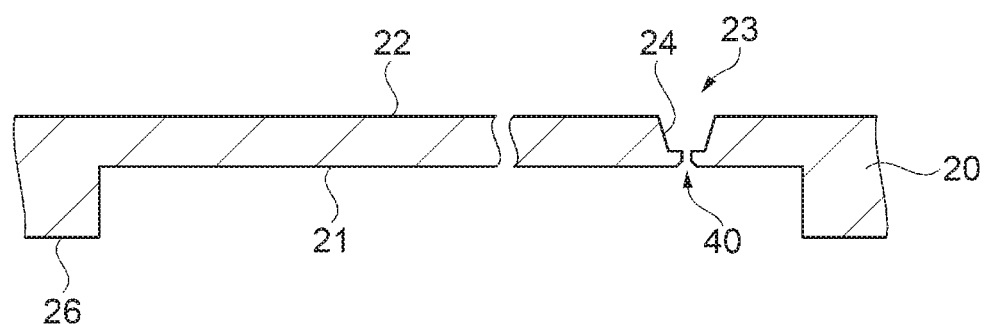
FIG. 13K is a sectional view for explaining the main manufacturing process for the lid body.

Thereafter, as shown in FIG. 13K, when the etching protection films 310 and 311 and the oxide film formed on the inner walls of the first hole section 23 and the second hole section 40 are simultaneously peeled and removed, the lid body 20 including the first hole section 23 and the second hole section 40 having a desired shape shown in FIGS. 4 to 6 is obtained.

1.6 Bonding Step

Figure 14A:
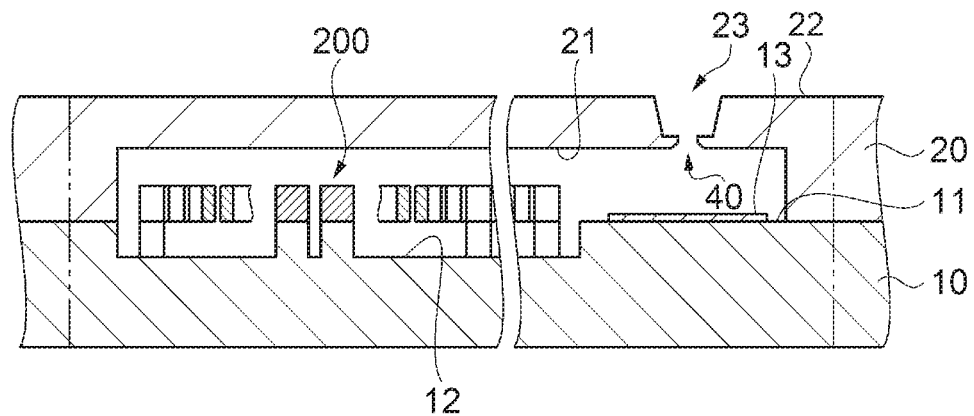
FIG. 14A is a sectional view for explaining a main manufacturing process for an electronic device.

Subsequently, as shown in FIG. 14A, the lid body 20, in which the first hole section 23 and the second hole section 40 are formed, is bonded to the multi-patterned wafer-like substrate 10, on which the recess 12 and the metal film 13 are provided by etching or sputtering and the functional element 200 formed by etching such as a Bosch method is disposed, to cover the functional element 200 in the recess 21.

As a bonding method for the lid body 20, for example, a boding method by a bonding member such as low melting point glass, an anodic bonding method, a direct bonding method, and a eutectic bonding method by a metal thin film can be suitably used. The anodic bonding method is assumed here. Alternate long and two short dashes lines on the left and right in FIGS. 14A to 14D indicate dividing positions during individual division.

1.7 Metal Film Forming Step

Figure 14B:
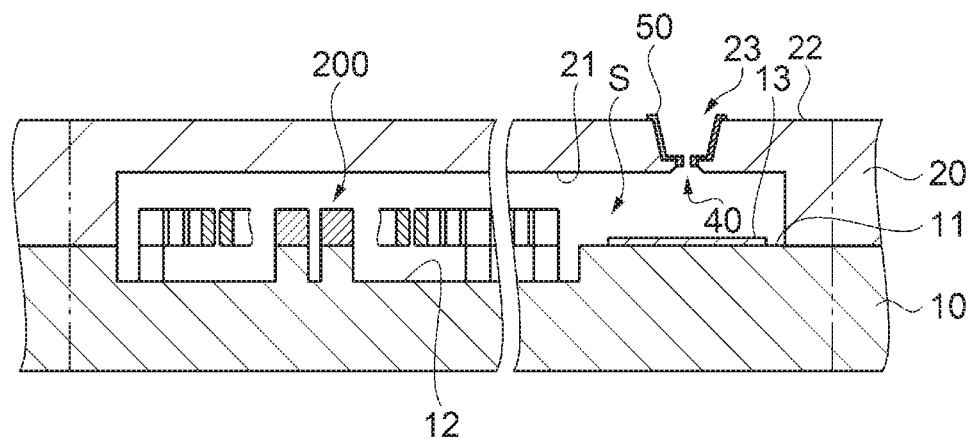
FIG. 14B is a sectional view for explaining the main manufacturing process for the electronic device.

Subsequently, as shown in FIG. 14B, the metal film 50 including the first layer 51 and the second layer 52 is formed on the inclined surface 24 and the bottom surface 25 of the first hole section 23, the inner wall surface 41 of the second hole section 40, and the curved surfaces of the joining sections 27, 28, and 42 using a not-shown sputtering device or the like.

Sputtering of the metal film 50 is performed by a long slow sputtering method. The long slow sputtering method is a sputtering method of securing the distance between a target and a wafer larger than the distance in the sputtering in the past and performing electric discharge at a sputtering discharge pressure lower in one digit or more to secure a large ratio of linear sputter particles reaching the wafer and improve accumulation efficiency in micro holes and micro grooves on the wafer. Accordingly, the metal film 50 having suitable thickness can be formed on the inner wall surface 41 on the inside of the second hole section 40 that is finer compared with the first hole section 23.

By forming the metal film 50 on the inclined surface 24, the bottom surface 25, and the inner wall surface 41, the melted sealing member 30 can be wet and spread in the first hole section 23 and the second hole section 40. In particular, since the metal film 50 is disposed on the curved surface of the joining section 42 connecting the bottom surface 25 and the inner wall surface 41, the melted sealing member 30 can be easily wet and spread on the inner wall surface 41 of the second hole section 40.

1.8 Sealing Step

Figure 14C:
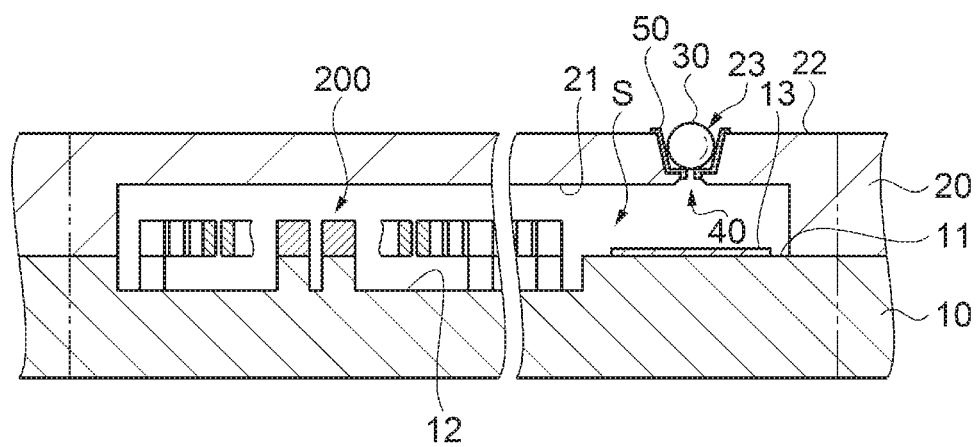
FIG. 14C is a sectional view for explaining the main manufacturing process for the electronic device.

Subsequently, as shown in FIG. 14C, gas such as air in the space S is discharged using a not-shown vacuum chamber or the like, the space S is set in a vacuum state, for example, to 10 Pa or less, and the sealing member 30 having a spherical shape is placed in the first hole section 23 of the lid body 20. When the functional element 200 is the acceleration sensor as explained above, after the chamber is once set in the vacuum state to remove moisture, an inert gas such as nitrogen is introduced up to the atmospheric pressure and, then, the spherical sealing member 30 is placed in the first hole section 23 of the lid body 20.

Figure 14D:
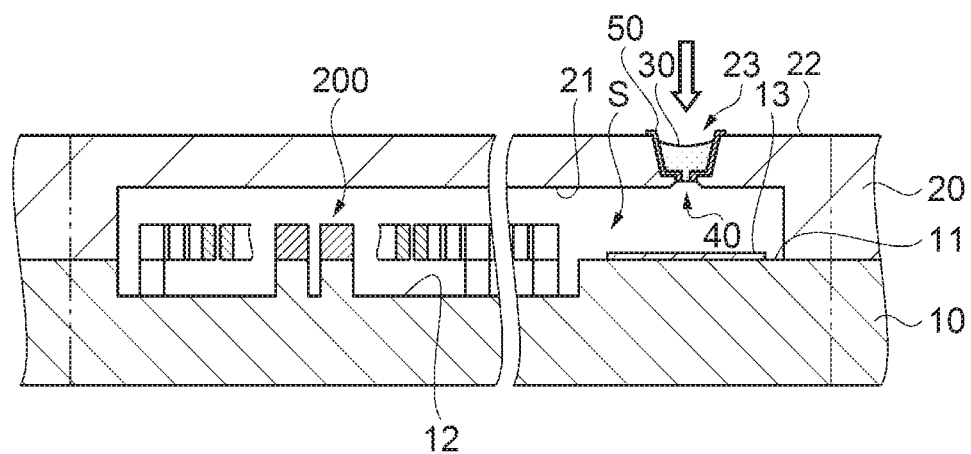
FIG. 14D is a sectional view for explaining the main manufacturing process for the electronic device.

Subsequently, as shown in FIG. 14D, a laser beam, an electron beam, or the like is irradiated on the spherical sealing member 30 to melt the sealing member 30, the sealing member 30 is spread in the first hole section 23, and the first hole section 23 is sealed. Since the metal film 50 is formed on the inner wall surface 41, the melted sealing member 30 spreads to the inside of the second hole section 40. Consequently, the space S is airtightly sealed in the vacuum state.

It is preferable to use, as the laser beam, a laser beam having a relatively short wavelength such as a YAG laser beam or a $CO_2$ laser beam and melt the sealing member 30 in a short time.

In this case, since the shape of the joining sections 27, 28, and 42 of the first hole section 23 and the second hole section 40 is the curved surface shape, concentration of stress caused by melting and solidification of the sealing member 30 during the irradiation of the laser beam or the like is reduced. Occurrence of cracks or the like starting from the joining sections 27 and 28 in the first hole section 23 and the joining section 42 in the second hole section 40 is suppressed.

When the metal film 13 is formed in a position on the principal plane 11 of the substrate 10 opposed to the second hole section 40, during the sealing of the second hole section 40, the metal film 13 is heated to temperature equal to or higher than temperature at which the metal film 13 can be eutectic-crystalized with the sealing member 30, for example, when the metal film 13 is Au and the sealing member 30 is an Au—Ge alloy, around 280° C. at which eutectic crystallization of Au and Ge begins.

Consequently, a part of splashes of the sealing member 30 scattered in the space S from the second hole section 40 by the irradiation of the laser beam in melting the sealing member 30 is heated to temperature equal to or higher than 280° C. The sealing member 30 is changed to a eutectic crystallized state with the metal film 13 and adheres to the metal film 13.

Consequently, it is possible to suppress deficiencies: for example, the splashes of the scattered sealing member 30 move on the substrate 10 and affect the functional element 200.

1.9 Dividing Step

Figure 14E:
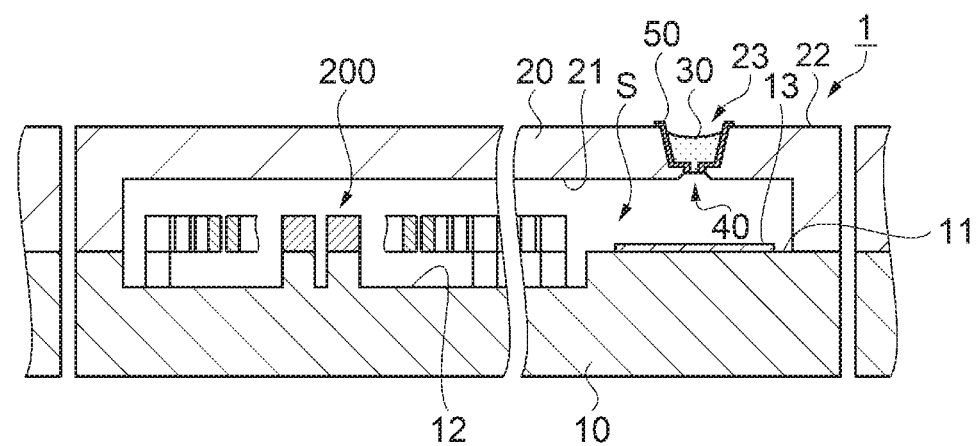
FIG. 14E is a sectional view for explaining the main manufacturing process for the electronic device.

Subsequently, as shown in FIG. 14E, the angular velocity sensor 1 is separately divided using a cutting device such as a not-shown dicing saw.

The angular velocity sensor 1 shown in FIGS. 1 and 2 can be obtained through the steps explained above.

As explained above, the manufacturing method for the angular velocity sensor 1 includes the thermal oxidation step in the forming process for the first hole section 23 and the second hole section 40 of the lid body 20. Therefore, the bottom surface 25 and the inclined surface 24 of the first hole section 23 can be thermally oxidized. The joining section 27 connecting the inclined surface 24 and the bottom surface 25, the joining section 28 connecting the inclined surface 24 and the outer surface 22, and the joining section 42 connecting the bottom surface 25 and the inner wall surface 41 can be easily formed as curved surfaces. Accordingly, stress involved in melting and solidification of the sealing member 30 less easily concentrates on the joining section 27. Occurrence of cracks starting from the joining sections 27, 28, and 42 can be suppressed.

As a result, the manufacturing method for the angular velocity sensor 1 is capable of keeping the space S formed by the substrate 10 and the lid body 20 in the airtight state. Stable operation of the functional element 200 can be maintained. Deficiencies such as deterioration of the functional element 200 due to contact with outside air can be suppressed. Accordingly, the angular velocity sensor 1 having high reliability can be provided.

In the manufacturing method for the angular velocity sensor 1, metal is sputtered by the long slow sputtering in the process for forming the metal film 50 on the inclined surface 24, the bottom surface 25, and the inner wall surface 41. Therefore, a ratio of linear sputter particles can be increased. In particular, deposition efficiency on the inner wall surface 41 of the fine second hole section 40 can be improved.

Accordingly, the metal film 50 having suitable thickness can be easily formed on the inclined surface 24 and the bottom surface 25 of the first hole 23 and the inner wall surface 41 of the second hole section 40.

2. Second Embodiment

An electronic apparatus including the electronic device explained above is explained.

Figure 15:
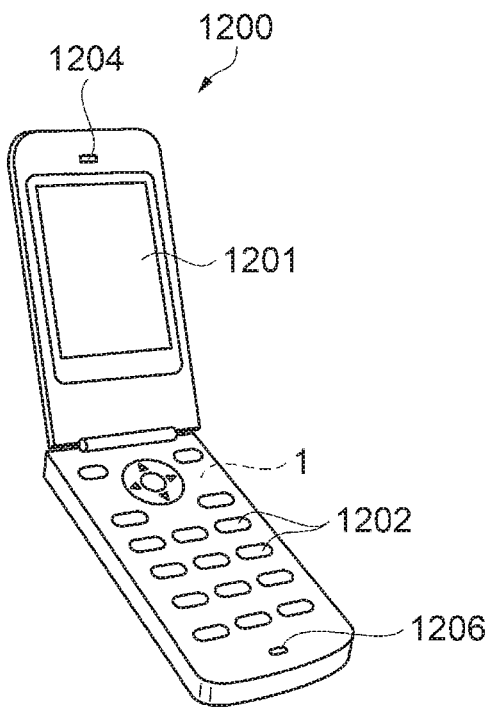
FIG. 15 is a perspective view showing the configuration of a cellular phone functioning as an electronic apparatus including an electronic device according to a second embodiment.

FIG. 15 is a perspective view showing the configuration of a cellular phone 1200 functioning as the electronic apparatus including the electronic device.

As shown in FIG. 15, the cellular phone 1200 includes a plurality of operation buttons 1202, an earpiece 1204, and a mouthpiece 1206. A display section 1201 is disposed between the operation button 1202 and the earpiece 1204.

The angular velocity sensor 1 functioning as the electronic device is incorporated in such a cellular phone 1200.

Since such an electronic apparatus includes the electronic device explained above, the effects explained in the embodiment is reflected on the electronic apparatus. The electronic apparatus is excellent in reliability.

Examples of the electronic apparatus including the electronic device explained above includes, besides the cellular phone, an inkjet type discharging apparatus such as an inkjet printer, laptop and mobile personal computers, a television, a digital still camera, a video camera, a video tape recorder, various navigation apparatuses, a pager, an electronic notebook including an electronic notebook with a communication function, an electronic dictionary, an electronic calculator, an electronic game machine, a word processor, a work station, a videophone, a television monitor for crime prevention, electronic binoculars, a POS terminal, a fish finder, various measurement instruments, meters, a flight simulator, and medical equipment such as an electronic thermometer, a manometer, a blood glucose meter, an electrocardiographic apparatus, an ultrasonic diagnosis apparatus, and an electronic endoscope. In all the cases, these electronic apparatuses include the electronic device explained above. Therefore, the effects explained in the embodiment are reflected on the electronic apparatuses. The electronic apparatuses are excellent in reliability.

3. Third Embodiment

A vehicle including the electronic device explained above is explained.

Figure 16:
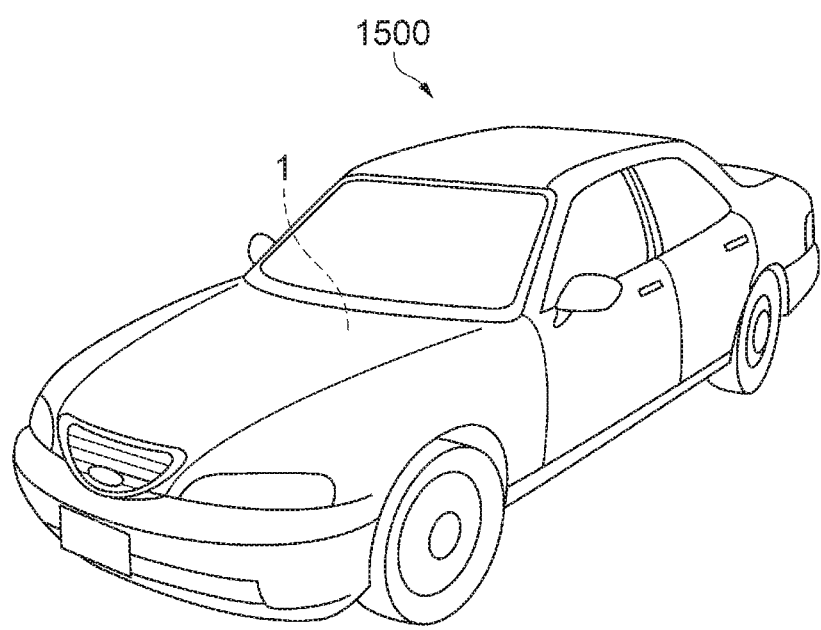
FIG. 16 is a perspective view showing the configuration of an automobile functioning as a vehicle including an electronic device according to a third embodiment.

FIG. 16 is a perspective view showing an automobile 1500 functioning as an example of the vehicle including the electronic device.

In the automobile 1500, the angular velocity sensor 1 functioning as the electronic device is used as, for example, a navigation device and a posture detection sensor such as a posture control device mounted on the automobile 1500.

Consequently, the automobile 1500 includes the electronic device explained above. Therefore, the effects explained in the embodiment are reflected on the automobile 1500. The automobile 1500 is excellent in reliability.

The electronic device is not limited to the automobile 1500 and can be suitably used as a posture detection sensor and the like of vehicles including a self-propelled robot, a self-propelled conveying apparatus, a train, a ship, an airplane, and an artificial satellite. In all the cases, the effects explained in the embodiment are reflected on the vehicles. Therefore, the vehicles excellent in reliability can be provided.

The electronic device explained above is not limited to the angular velocity sensor 1 and may be an acceleration sensor, a functional element of which has an acceleration detecting function, a pressure sensor, a functional element of which has a pressure detecting function, a weight sensor, a functional element of which has a weight detecting function, a composite sensor obtained by combining these sensors including the angular velocity sensor 1, and the like.

In the case of the acceleration sensor, an inert gas such as nitrogen, argon, or helium is filled in an internal space. Excessive displacement of the functional element is suppressed by damping, so-called viscous resistance of the inert gas.

The electronic device may be a vibrator, an oscillator, a frequency filter, or the like, a functional element of which is a vibrator element.

Contents derived from the embodiment are described below.

An electronic device includes: a substrate; a functional element disposed on one surface of the substrate; a lid body, the functional element being housed in a space covered by the lid body and the substrate, the lid body including a first surface at a side opposed to the functional element, a second surface at an opposite side of the first surface, a first hole section including an inclined surface and a bottom surface on the second surface, and a second hole section piercing through the lid body between the first surface and the bottom surface and having an inner wall surface, a joining section of the inclined surface and the bottom surface in the first hole section being a curved surface, the lid body containing silicon; and a sealing member that seals the first hole section communicating with the space.

With this configuration, since the joining section of the inclined surface and the bottom surface of the first hole section provided in the lid body forming the space in which the substrate and the functional element are housed is the curved surface, stress involved in the melting and solidification of the sealing member less easily concentrates on the joining section. A crack starting from the joining section can be suppressed. Since residual stress less easily concentrates on the joining section, cracks caused by a thermal shock and the like can also be suppressed.

As a result, the electronic device is capable of keeping the space formed by the substrate and the lid body in the airtight state. Stable operation of the functional element can be maintained. Deficiencies such as deterioration of the functional element due to contact with outside air can be suppressed.

In the electronic device, a curvature radius of the curved surface is preferably 5 nm or more and 50 µm or less.

With this structure, since the curvature radius of the curved surface of the joining section is 5 nm or more and 50 µm or less, stress involved in melting and solidification of the sealing member less easily concentrates on the joining section. Occurrence of a crack starting from the joining section can be suppressed.

In the electronic device, a joining section of the inclined surface and the second surface is preferably a curved surface.

With this configuration, since the joining section of the second surface and the inclined surface is the curved surface, even if the melted sealing member spreads to the second surface, stress involved in melting and solidification of the sealing member less easily concentrates on the joining section. Occurrence of a crack starting from the joining section can be suppressed.

In the electronic device, a joining section of the bottom surface and the inner wall surface is preferably a curved surface.

With this configuration, since the joining section of the bottom surface and the inner wall surface is the curved surface, stress involved in melting and solidification of the sealing member less easily concentrates on the joining section. Occurrence of a crack starting from the joining section can be suppressed.

In the electronic device, a metal film is preferably disposed on the inclined surface, the bottom surface, and the inner wall surface.

With this configuration, since the metal film is disposed on the inclined surface, the bottom surface, and the inner wall surface, the melted sealing member can be easily wet and spread in the first hole section and the second hole section.

In the electronic device, the metal film is preferably disposed on the curved surface of the bottom surface and the inner wall surface.

With this configuration, since the metal film is disposed on the curved surface of the bottom surface and the inner wall surface, the melted sealing member can be easily wet and spread on the inner wall surface of the second hole section.

A manufacturing method for an electronic device is a manufacturing method for an electronic device including: a substrate; a functional element disposed on one surface of the substrate; a lid body, the functional element being housed in a space covered by the lid body and the substrate, the lid body including a first surface at a side opposed to the functional element, a second surface at an opposite side of the first surface, a first hole section including an inclined surface and a bottom surface on the second surface, and a second hole section piercing through the lid body between the first surface and the bottom surface and having an inner wall surface, a joining section of the inclined surface and the bottom surface in the first hole section being a curved surface, the lid body containing silicon; and a sealing member that seals the first hole section communicating with the space, the manufacturing method for the electronic device including a thermal oxidation step in a forming process for the first hole section and the second hole section of the lid body.

With this configuration, since the forming process for the first hole section and the second hole section of the lid body includes the thermal oxidation step, the joining section connecting the inclined surface and the bottom surface can be easily formed as the curved surface by thermally oxidizing the inclined surface and the bottom surface of the first hole section. Accordingly, stress involved in melting and solidification of the sealing member less easily concentrates on the joining section. Occurrence of a crack starting from the joining section can be suppressed.

As a result, the manufacturing method for the electronic device is capable of keeping the space formed by the substrate and the lid body in the airtight state. Stable operation of the functional element can be maintained. Deficiencies such as deterioration of the functional element due to contact with outside air can be suppressed.

In the manufacturing method for the electronic device, the manufacturing method for the electronic device preferably includes a metal film forming step by long slow sputtering in a process for forming a metal film on the inclined surface, the bottom surface, and the inner wall surface.

With this configuration, metal is sputtered by the long slow sputtering in the process for forming the metal film on the inclined surface, the bottom surface, and the inner wall surface. Therefore, a ratio of linear sputter particles can be increased. In particular, deposition efficiency on the inner wall surface of the fine second hole section can be improved.

Accordingly, the metal film having suitable thickness can be easily formed on the inclined surface and the bottom surface of the first hole section and the inner wall surface of the second hole section.

An electronic apparatus includes the electronic device.

With this configuration, since the electronic apparatus includes the electronic device in which occurrence of the crack is suppressed and reliability is improved, the electronic apparatus excellent in reliability can be provided.

A vehicle includes the electronic device.

With this configuration, since the vehicle includes the electronic device in which occurrence of the crack is suppressed and reliability is improved, the vehicle excellent in reliability can be provided.

What is claimed is:
1. An electronic device comprising:
a substrate;
a functional element disposed on one surface of the substrate;
a lid body, the functional element being housed in a space covered by the lid body and the substrate, the lid body including:
a first surface facing the functional element;
a second surface at an opposite side of the first surface;
a first hole section including an inclined surface and a bottom surface on the second surface;
a second hole section piercing through the lid body between the first surface and the bottom surface of the first hole section and having an inner wall surface; and
a first joining section of the inclined surface and the bottom surface in the first hole section being a first curved surface along a vertical direction in a cross section of the inclined surface and the bottom surface of the first hole section, the lid body containing silicon; and a sealing member that seals the first hole section communicating with the space, wherein a curvature radius of the first curved surface is in a range of 5 nm and 50 μm.

2. The electronic device according to claim 1, wherein a second joining section of the inclined surface and the second surface is a second curved surface.

3. The electronic device according to claim 1, wherein a third joining section of the bottom surface and the inner wall surface is a third curved surface.

4. The electronic device according to claim 1, wherein a metal film is disposed on the inclined surface, the bottom surface, and the inner wall surface.

5. The electronic device according to claim 4, wherein a third joining section of the bottom surface and the inner wall surface is a third curved surface the metal film is disposed on the third curved surface.

6. An electronic apparatus comprising the electronic device according to claim 1.

7. A vehicle comprising the electronic device according to claim 1.

\* \* \* \* \*